(12) United States Patent
Cadag et al.

(10) Patent No.: US 9,842,794 B2
(45) Date of Patent: Dec. 12, 2017

(54) SEMICONDUCTOR PACKAGE WITH INTEGRATED HEATSINK

(71) Applicant: STMICROELECTRONICS, INC., Calamba (PH)

(72) Inventors: Ela Mia Cadag, Calamba (PH); Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 14/945,291

(22) Filed: Nov. 18, 2015

(65) Prior Publication Data

US 2017/0141014 A1    May 18, 2017

(51) Int. Cl.
| | | |
|---|---|---|
| *H01L 23/495* | (2006.01) | |
| *H01L 23/31* | (2006.01) | |
| *H01L 21/56* | (2006.01) | |
| *H01L 23/00* | (2006.01) | |

(52) U.S. Cl.
CPC .......... *H01L 23/4952* (2013.01); *H01L 21/56* (2013.01); *H01L 23/3121* (2013.01); *H01L 23/49568* (2013.01); *H01L 24/81* (2013.01); *H01L 2224/48091* (2013.01); *H01L 2224/73265* (2013.01); *H01L 2224/97* (2013.01); *H01L 2924/157* (2013.01)

(58) Field of Classification Search
None
See application file for complete search history.

(56) References Cited

U.S. PATENT DOCUMENTS

| | | |
|---|---|---|
| 6,750,545 B1 | 6/2004 | Lee et al. |
| 8,018,036 B2 | 9/2011 | Goh et al. |
| 2005/0272182 A1* | 12/2005 | Smith .................. H01L 23/3121 438/106 |
| 2006/0247392 A1* | 11/2006 | Ogura .................. C08G 59/066 525/523 |

* cited by examiner

*Primary Examiner* — Alexander Ghyka
(74) *Attorney, Agent, or Firm* — Seed Intellectual Property Law Group LLP (57) ABSTRACT

One or more embodiments are directed to semiconductor packages having an integrated heatsink and methods of forming same. In one embodiment, a package includes a plurality of leads that support and enclose periphery portions of the semiconductor die. The leads have first and second, opposing surfaces that form outer surfaces of the package. The first surface of the leads may form a heatsink and the second surface of the leads form lands of the package for coupling to another device, substrate, or board. The package includes encapsulation material that surrounds the semiconductor die and located between upper portions of the leads. The package further includes a back filling material (or insulating material) that is below the semiconductor die and between lower portions of the leads.

24 Claims, 11 Drawing Sheets

SEMICONDUCTOR PACKAGE WITH INTEGRATED HEATSINK

BACKGROUND

Technical Field

Embodiments of the present disclosure are directed to semiconductor packages and methods of assembling same.

Description of the Related Art

Leadless (or no lead) packages are often utilized in applications in which small sized packages are desired. In general, flat leadless packages provide a near chip scale encapsulated package formed from a planar leadframe. Lands located on a bottom surface of the package provide electrical connection to a board, such as a printed circuit board (PCB).

Typically, leadless packages include a semiconductor die or chip mounted to a die pad and electrically coupled to leads, such as by conductive wires. Improvements to make the packages thinner have eliminated the need for the die pad. In particular, chip-on-lead (COL) packages have the semiconductor die mounted directly on the leads without the die pad.

Current applications for semiconductor packaging desire packages that have reduced thicknesses, while at the same time efficiently removing heat generated by the semiconductor die in the package.

BRIEF SUMMARY

One or more embodiments are directed to semiconductor packages having an integrated heatsink and methods of forming same. In one embodiment, a package includes a plurality of leads that support and enclose periphery portions of the semiconductor die. The leads have first and second, opposing surfaces that form outer surfaces of the package. The first surface of the leads may form a heatsink and the second surface of the leads form lands of the package for coupling to another device, substrate, or board. The package includes encapsulation material that surrounds the semiconductor die and located between upper portions of the leads. The package further includes a back filling material (or insulating material) that is below the semiconductor die and between lower portions of the leads.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Figure 1A:
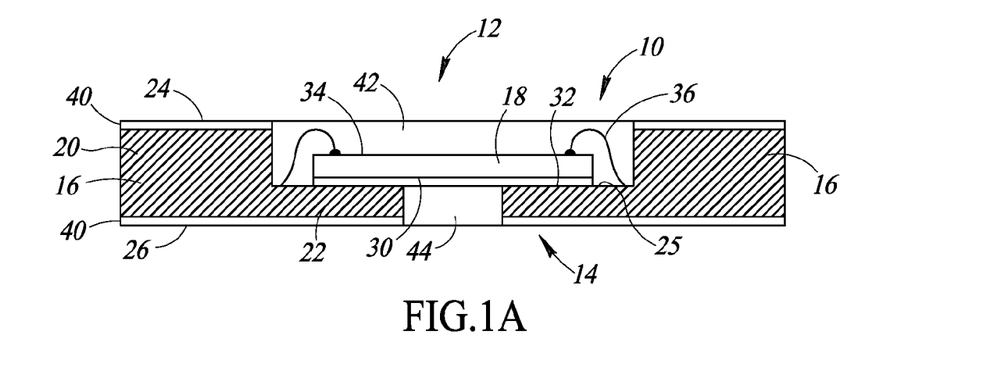
FIGS. 1A-1D are schematic illustrations of various views of a leadless package in accordance with one embodiment of the disclosure.
Figure 1B:
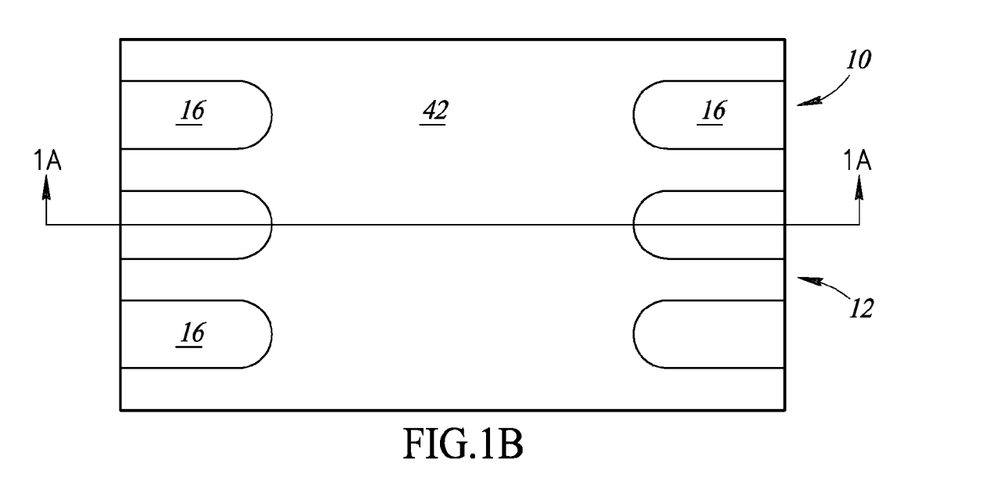
Figure 1C:
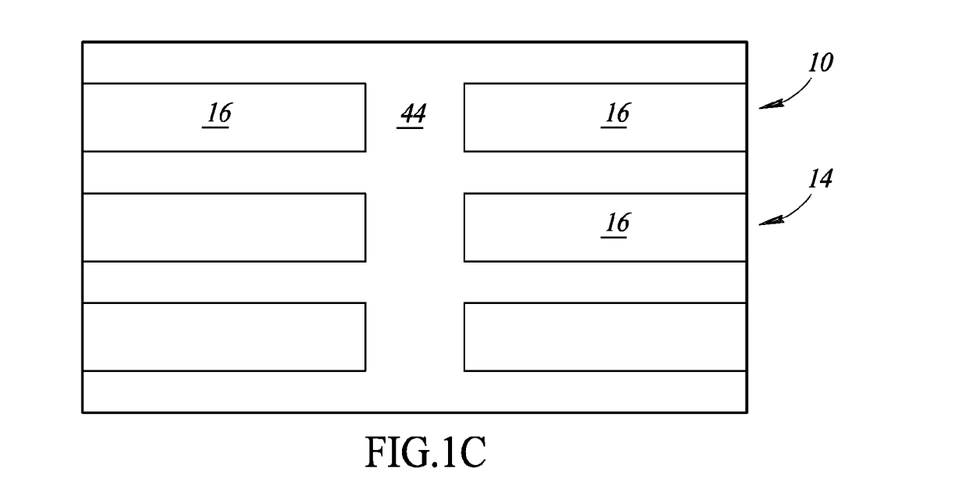
Figure 1D:
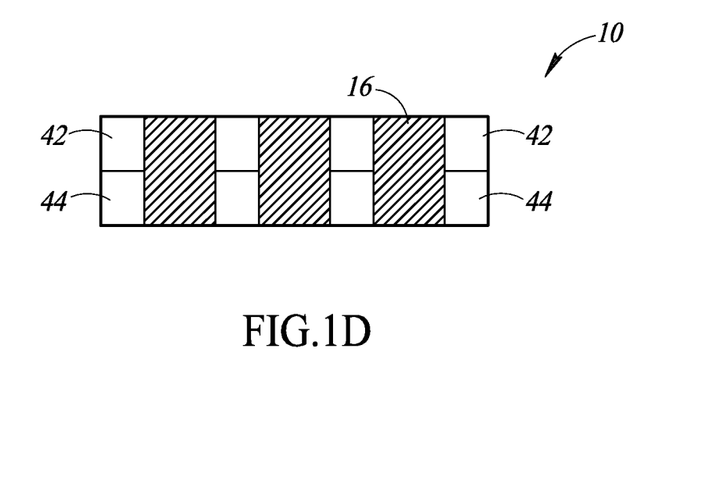

FIGS. 1A-1C are cross-sectional views of a leadless package 10 in accordance with one embodiment of the disclosure. FIG. 1B is a top plan view of the package 10 of FIG. 1A, while FIG. 1C is a bottom plan view of the package 10 of FIG. 1A.

As best shown in FIG. 1A, the package 10 includes a first surface 12 and a second, opposite surface 14 and a plurality of leads 16 having portions that extend from the first surface 12 to the second surface 14. A semiconductor die 18 is between the plurality of leads 16 and supported by the plurality of leads 16. In particular, the semiconductor die 18 is located between upper portions 20 of the leads 16 and is supported by lower portions 22 of the leads 16.

As shown in FIGS. 1B and 1C, the package 10 includes six leads along two sides that extend to a periphery of the package. The package, however, may include any number of leads that are located on any number of sides.

Figure 2:
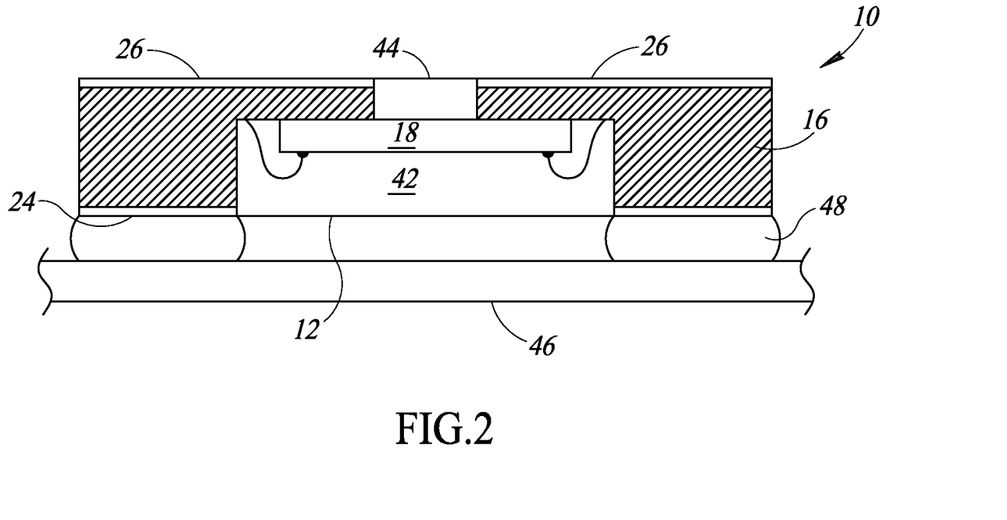
FIG. 2 is a cross-sectional view of a schematic illustration of the package of FIGS. 1A-1D attached to a board.

At the first surface 12 of the package 10, each of the leads 16 includes an upper surface 24 that is planar and forms a portion of the first surface 12 of the package 10 as best shown in FIG. 1B. The upper surface 24 of each lead 16 forms a land that is configured to be electrically coupled to another device or board, such as a printed circuit board, as shown in FIG. 2. At the second surface 14 of the package 10, each of the leads 16 form outer side surfaces of the package 10 that includes a lower surface 26 that is planar and forms a portion of the second surface 14 of the package 10 as best shown in FIG. 1C.

The lower surface 26 of each lead 16 remains exposed and acts as a heat sink that dissipates heat generated by the semiconductor die 18. At side surfaces of the package 10, the leads 16 extend from the first surface 12 of the package 10 to the second surface 14 of the package 10 and have thicknesses that substantially correspond to the overall thickness of the package 10. The lower portions 22 of the leads 16 have inner surfaces 25 that are internal to the package 10 as best shown in FIG. 1A.

A back surface 30 of the semiconductor die 18 is coupled to the inner surfaces 25 of the leads 16 by an adhesive material 32. The adhesive material 32 may be any material configured to secure the die 18 to the inner surfaces 25 of the lower portions 22 of the leads 16, such as glue, paste, tape, epoxy or any suitable material. The lower portions 22 of the leads 16 have thicknesses to provide suitable strength to support the semiconductor die 18.

The semiconductor die 18 is any semiconductor die that includes an electrical device, such as an integrated circuit or electromechanical sensor. The semiconductor die 18 has a front surface 34 that is opposite the back surface 30. The front surface 34 includes a plurality of bond pads, which may be located at the periphery of the front surface 34. The semiconductor die 18 is electrically coupled to the lower portion 22 of the leads 16 by conductive wires 36. For instance, a first end of the conductive wire 36 is coupled to a bond pad of the die 18 and a second end of the conductive wire is coupled to the inner surface 25 of the lower portion 22 of the lead 16. The conductive wire 36 may be any conductive material to electrically couple the semiconductor die 18 to the leads 16.

The upper and lower surfaces 24, 22 of the leads 16 may be plated with one or more conductive layers 40. The one or more conductive layers 40 are nanolayers or microlayers and may be of any conductive material. In one embodiment, the one or more conductive layers 40 are a plurality of stacked metal layers, such as Ni/Pd/Ag, Ni/Pd/Au—Ag alloy, or Ni/Pd/Au/Ag. As will be explained below, the one or more conductive layers 40 may form a mask layer for etching portions of a leadframe strip to form the leads of the package during an assembly process.

Encapsulation material 42 encapsulates the semiconductor die 18 and conductive wires 36 and the side surfaces of the upper portions 20 of the leads 16. The encapsulation material 42 forms a portion of the first surface 12 and side surfaces of the package 10. The encapsulation material 42 is an insulating material that protects the electrical components of the semiconductor die and conductive wires from damage, such as corrosion, physical damage, moisture damage, or other causes of damage to electrical devices and materials. In one embodiment, the encapsulation material 42 is a polymer, such as an epoxy mold.

At the second surface 14 of the package 10, below the semiconductor die 18 and the encapsulation material 42, and between the lower portions 22 of the leads 16, is a back filling material 44. The back filling material 44 is an insulating material and may be epoxy, silicon, photoresist, any material with low modulus properties, or any suitable material.

The back filling material 44 fills the space between the lower portions 22 of the leads 16 at the second surface 14 of the package 10 and electrically isolates the lower portion 22 of the leads 16 from each other as best shown in FIG. 1C. The back filling material 44 abuts the back surface 30 (or the adhesive material 32) of the semiconductor die 18 and the encapsulation material 42. Furthermore, the back filling material 44 abuts side surfaces of the lower portion 22 of the leads 16. The back filling material 44 may be configured to provide additional mechanical support and/or protection of the electrical components of the package 10.

It is to be appreciated that the overall thickness of the package 10 is the same as the thickness of the leadframe used to form the package. In one embodiment, the leadframe thickness, i.e., the thicknesses of the package, is about 0.2 millimeters.

FIG. 2 illustrates the package 10 of FIGS. 1A-1D mounted on a board, such as a printed circuit board (PCB) 46. The first surface 12 of the package 10 is facing a surface of the PCB 46. Thus, the upper surfaces 24 of the leads 16 are facing downward in FIG. 2 for coupling to the PCB 46. That is, the upper surfaces 24 of the leads 16 are electrically and mechanically coupled to lands of the PCB 46 by conductive bumps 48 therebetween as is well known in the art. An underfill material (not shown) may be provided between the first surface 12 of the package 10 and the PCB 46. The lower surfaces 26 of the leads 16 face away from the PCB 46 and act as a heatsink to dissipate heat generated by the semiconductor die 18 to the external environment. In one embodiment, the lower surfaces 26 of the leads 16 occupy 50% to 70% of the second surface 14 of the package 10. In that regard, the lower portions 22 of the leads 16 act as an integrated heatsink for removing heat generated from the package 10 and transferring the heat to the external environment. Thus, the overall thickness of the package 10 with a heatsink integrated therein is much less than has been available with a heatsink mounted onto a package.

Figure 3A:
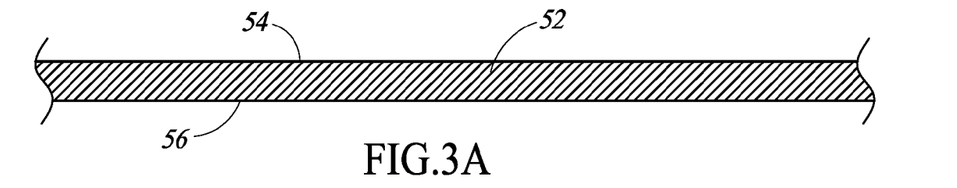
FIGS. 3A-3H illustrate various stages of forming a leadframe strip in accordance with an embodiment of the present disclosure.
Figure 3B:
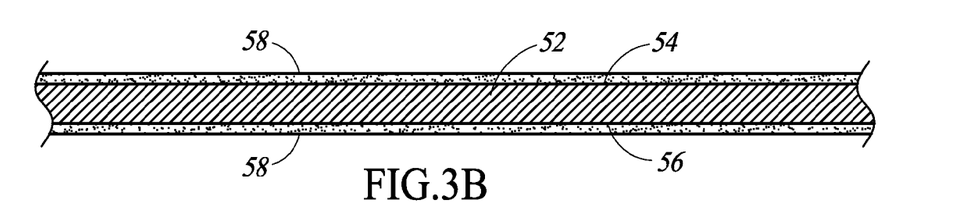
Figure 3C:
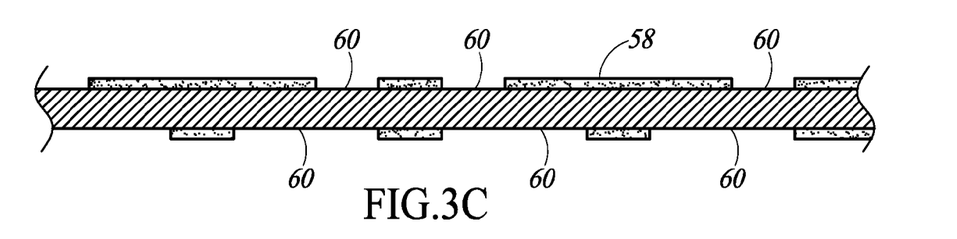
Figure 3D:
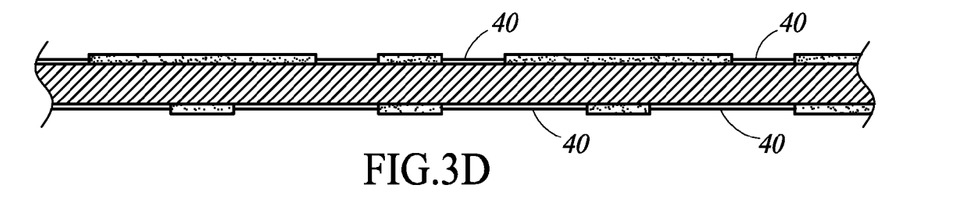
Figure 3E:
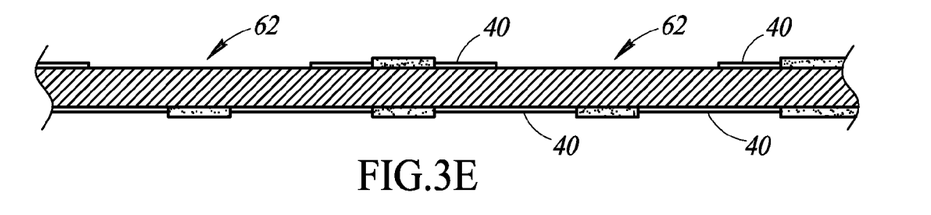
Figure 3F:
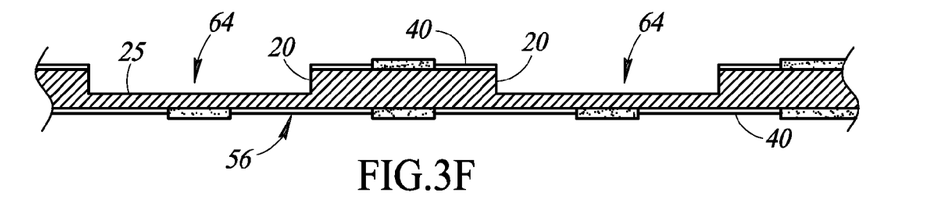
Figure 3G:
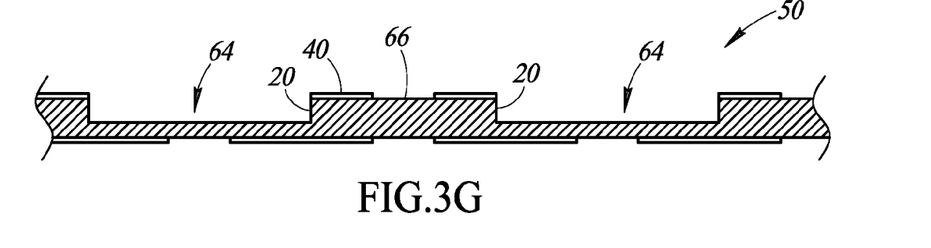
Figure 3H:
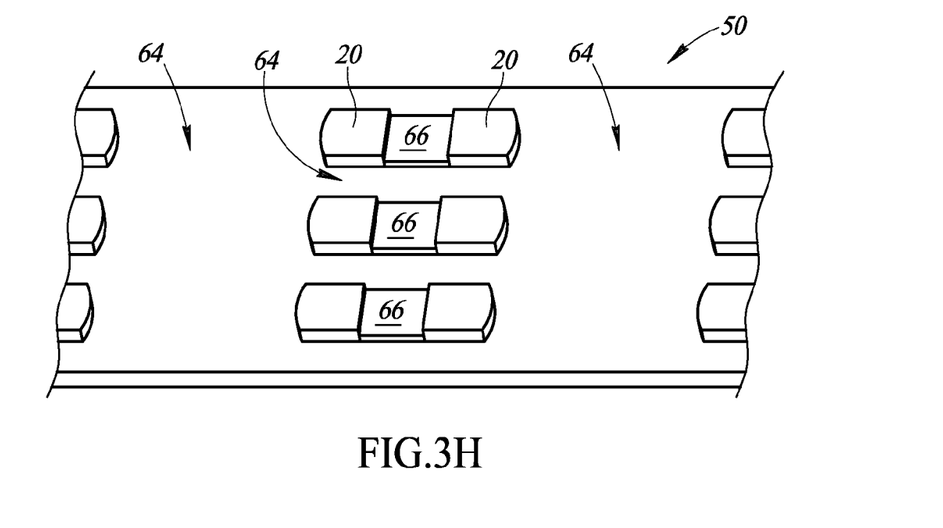

FIGS. 3A-3G illustrate cross-sectional views of a portion of a conductive foil 52 that is formed into a leadframe strip 50 at various stages of manufacturing in accordance with an embodiment of the present disclosure, and FIG. 3H illustrates an isometric view of the leadframe strip of FIG. 3G. The leadframe strip 50 as shown in FIGS. 3G and 3H may be used to make the leadframe package 10 of FIG. 1.

FIG. 3A shows a conductive foil 52 that is the base material for forming the leadframe strip 50. The conductive foil 52 is any conductive material, and may be a metal material, such as copper or a copper alloy. The conductive foil 52 has an upper surface 54 and a lower, opposite surface 56.

As shown in FIG. 3B, a light sensitive material 58, such as photoresist, is blanket deposited on first and second surfaces 54, 56 of the conductive strip 50. As shown in FIG. 3C, the light sensitive material 58 is patterned to form a mask layer as is well known in the art. The light sensitive material 58 may be positive or negative photoresist. For instance, in one embodiment, portions of the light sensitive material 58 may be exposed to ultraviolet radiation and then removed by a photoresist developer, leaving exposed portions 60 of the conductive foil 52 on the first and second surfaces 54, 56.

As shown in FIG. 3D, one or more conductive layers 40 are plated on the exposed portions 60 of the conductive foil 52 using known techniques. Plating may include plating one or more conductive layers 40, which may be a stack of metal layers, such as Ni/Pd/Ag, Ni/Pd/Au—Ag alloy, Ni/Pd/Au/Ag or any other stack. Alternatively, the one or more conductive layers may be a single layer, such as a single metal layer.

As shown in FIG. 3E, the light sensitive material 58 is removed from the first surface at regions 62. The light sensitive material 58 remains on the other areas of the first and second surface 54, 56. The one or more conductive layers 40 and the light sensitive material 58 together form a mask layer. As shown in FIG. 3F, the upper surface of conductive foil at the region 62 is etched to form openings 64 as is well known in the art. The conductive foil is etched a distance that is greater than a thickness of a semiconductor die to be assembled therein, as will be explained in more detail below. In one embodiment, the conductive foil is etched between 50% and 80% of the thickness of the conductive foil, and in one embodiment is etched 70% of the conductive foil. In one embodiment, the conductive foil 52 may be etched by immersion in a bath of etchant and in some cases includes agitation techniques.

The openings 64 of the conductive foil 52 forms an inner surface 25, some of which is the lower portion 26 of the leads of FIGS. 1A-1D, while the raised un-etched portion of the first surface 54 forms the upper portion 20 of the leads of FIGS. 1A-1D, as will be explained in more detail in reference to FIGS. 4A-4F, which illustrate the assembly process. Finally, as shown in FIG. 3G, the light sensitive material 64 is removed from the first and second surfaces 54, 56 of the conductive foil 52, thereby forming the leadframe strip 50 for use during assembly.

FIG. 3H is an isometric view of the leadframe strip 50. As shown in FIG. 3H, the openings 64 formed in the etching step of FIG. 3F extend between adjacent upper portions 20 of the leads. The leadframe strip 50 has a first thickness defined by the inner surface 25 and the second surface 56 and a second thickness defined by the upper portion 20 of the leads and the second surface 56. The upper portions 20 of the leads remain coupled to each other by connecting portions 66. The inner surface 25 of the leads are coupled together by inner connecting portions 67.

Figure 4A:
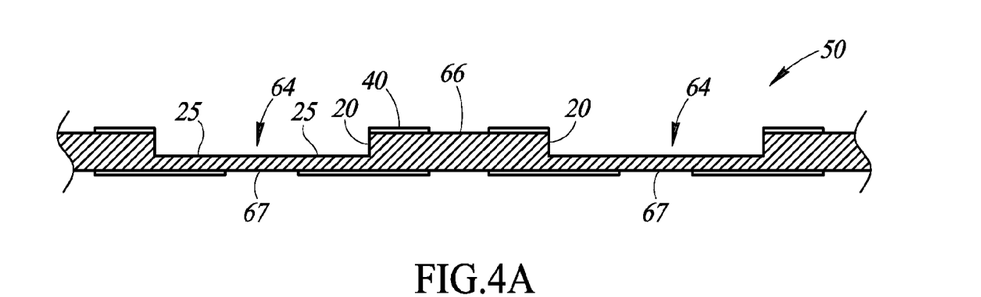
FIGS. 4A-4F illustrate cross-sectional views of various stages of an assembly process for forming packages, such as the package of FIGS. 1A-1D, in accordance with an embodiment of the present disclosure.

FIGS. 4A-4F illustrate cross-sectional views of various stages of assembling a package, such as the package 10 of FIGS. 1A-D in accordance with one embodiment of the disclosure. FIG. 4A shows a leadframe strip 50, such as the leadframe strip 50 of FIGS. 3G-3H.

Figure 4B:
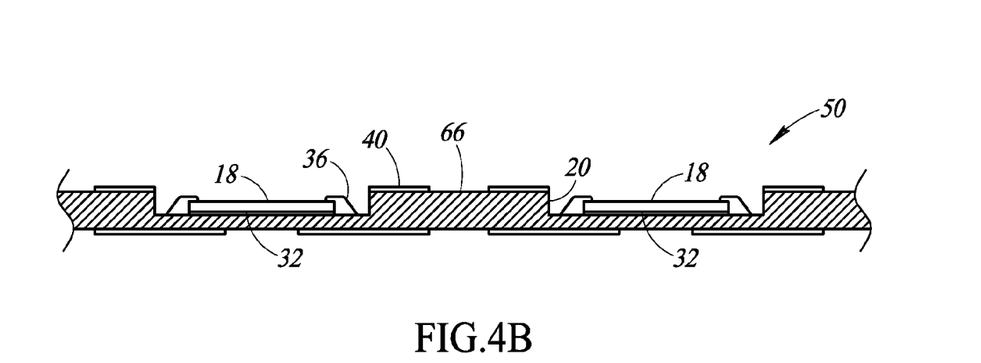

As shown in FIG. 4B, semiconductor dice 18 are coupled to inner surfaces 25 and inner connecting portions 67 of the leadframe strip 50 between upper portions 20 of the leads. For instance, an adhesive material 32 may be placed on the bottom surface 30 of the semiconductor dice 18 and/or on the inner surface 25 of the leadframe strip 50 prior to placing the semiconductor dice 18 on the inner surface 25.

The semiconductor dice 18 are electrically coupled to the set of leads by conductive wires 36 using standard wire bonding techniques. That is, first ends of the conductive wires 36 are coupled to bond pads of the semiconductor dice 18, and second ends of the conductive wires 36 are coupled to the inner surface 25 of the leadframe strip 50 between the semiconductor die 18 and the upper portions 20 of the leads, respectively.

Figure 4C:
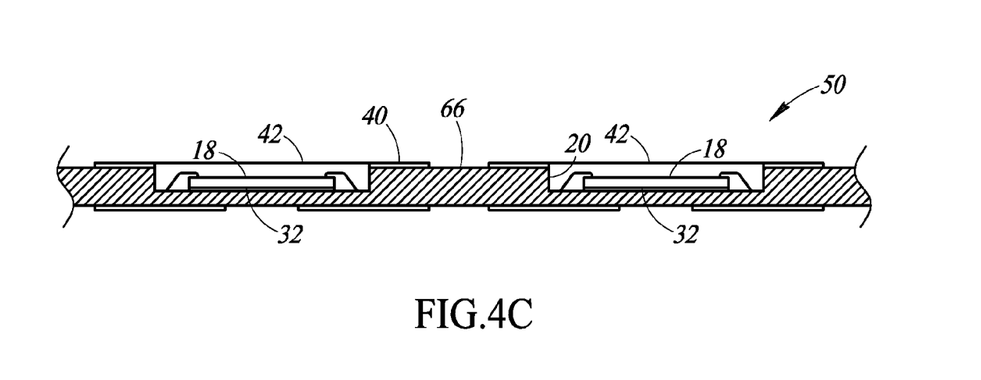

As shown in FIG. 4C, encapsulation material 42 is formed around the semiconductor die 18 and the conductive wires 36 using conventional techniques. For instance, the encapsulation material may be molded in a molding process. It is to be appreciated that the leadframe strip 50 does not include through openings that extend to the lower surface. Thus, the encapsulation material 42 that is formed around the semiconductor die 18 does not flow through to the lower surface of the leadframe strip 50. The encapsulation material 24 is molded over the inner surface 25 of the leadframe strip 50 and between upper portions 20 of the leads. The encapsulation material 42 hardens over time and may harden in a curing step.

Figure 4D:
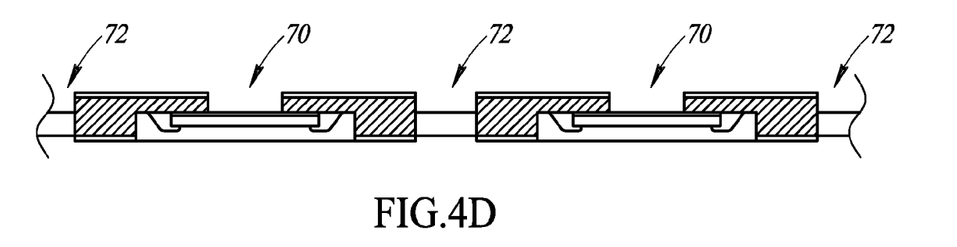

In FIG. 4D, the leadframe strip 50 is flipped over so that the lower surface of the leadframe strip 50 is facing up. Portions of the leadframe strip 50 are etched from the lower surface using known leadframe etching techniques. The one or more conductive layers 40 on the upper and lower surfaces of the leadframe strip 50 act as an etch pattern during the etch step. Thus, the portions of the leadframe strip 50 that have the one or more conductive layers 40 thereon are not etched, while the areas in which the leadframe material 50 is exposed are etched away. Thus, the inner connecting portions 67 are etched to expose the semiconductor die 18 (or the adhesive material). Additionally, connecting portions 66 between the leads of adjacent packages are etched. Although not shown in the cross-sectional views, the etching of the leadframe strip 50 separates leadframe material between adjacent leads within a package, such as those extending in and out of the page.

The encapsulation material 42 that was formed between adjacent leads of individual packages remains between the leads of adjacent packages; however, the thickness of the encapsulation material 42 is the thickness of the depth of the edge as described in reference to FIG. 3E. The encapsulation material 42 between the adjacent packages forms a dicing street for singulation into individual packages as will be discussed below.

Figure 4E:
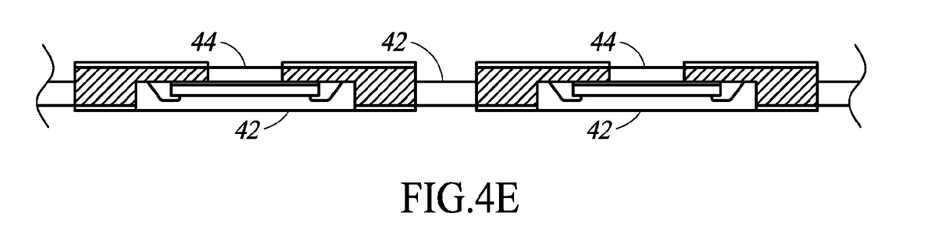
Figure 4F:
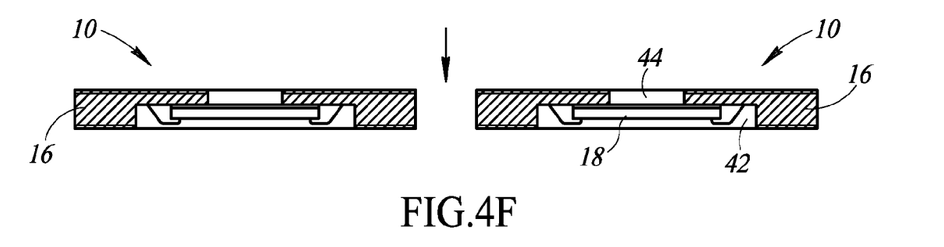

As shown in FIG. 4E, a back filling material 44 is deposited on the back surface 30 of the semiconductor die 18 and over the encapsulation material 42 exposed in the etch step described in reference to FIG. 4D. As discussed above, the back filling material 44 is an insulating material and may be epoxy, silicon, photoresist, a material with low modulus properties, or any other suitable material.

The assembly process further includes separating each package 10 into individual packages 10 as shown in FIG. 3F. The packages 10 can be separated by various dicing methods, including sawing, punching, and laser. The encapsulation material 42 and/or the back filling material 44 may be used as a dicing street as a visual alignment for the dicing tool.

It is to be appreciated that the above method does not require a support structure or tape backing material during the assembly process. That is, the leadframe strip 50 is sufficiently stiff to support the assembly process. It is to be noted that the leadframe strip does not have through openings that extend through the entire thickness of the material, which can reduce the stiffness of the leadframe strip.

Furthermore, the assembly process described herein involves dicing through the encapsulation material 42 and/or the back filling material 44, which are easier to dice through compared with leadframe material. Thus, by using an etch step to separate the leads and then dicing through the encapsulation material 42 and/or the back filling material 44, many benefits may be obtained. In particular, dicing through encapsulation material 42 and/or the back filling material 44 without having to dice through leadframe material can prevent or reduce saw burrs from being formed on surfaces of the leads. That is, cutting through the leadframe material is known to cause saw burrs. Additionally, separating the leads during an etch step further eliminates lead smearing that is associated with saw blade dicing through the leadframe material. Furthermore, by sawing through the encapsulation material and/or back filling material, the sawing speed may be increased, thereby increasing throughput through the sawing tools. In addition, the blade life of the saw blades used to cut the packages into individual packages will increase. Furthermore, singulating by punching may also be used.

Figure 5A:
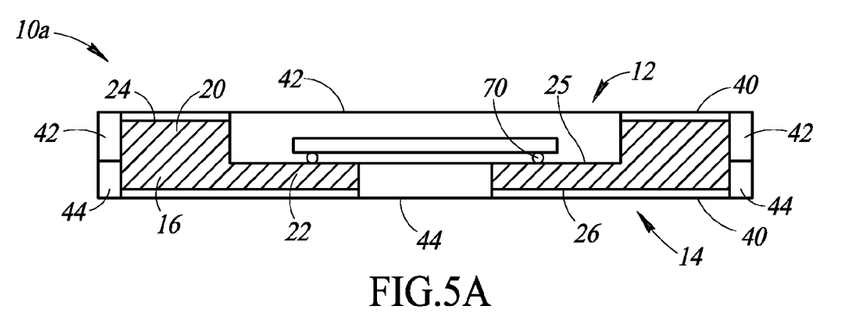
FIGS. 5A-5C are schematic illustrations of various views of a leadless package in accordance with another embodiment of the disclosure.
Figure 5B:
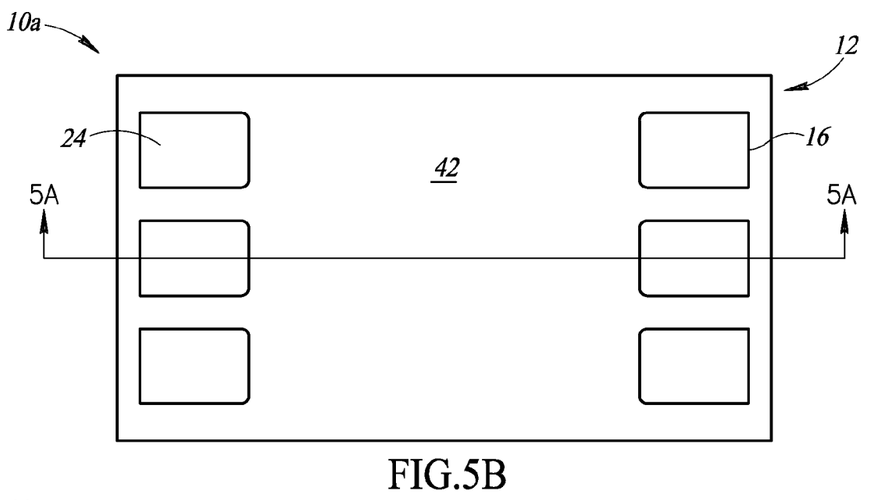
Figure 5C:
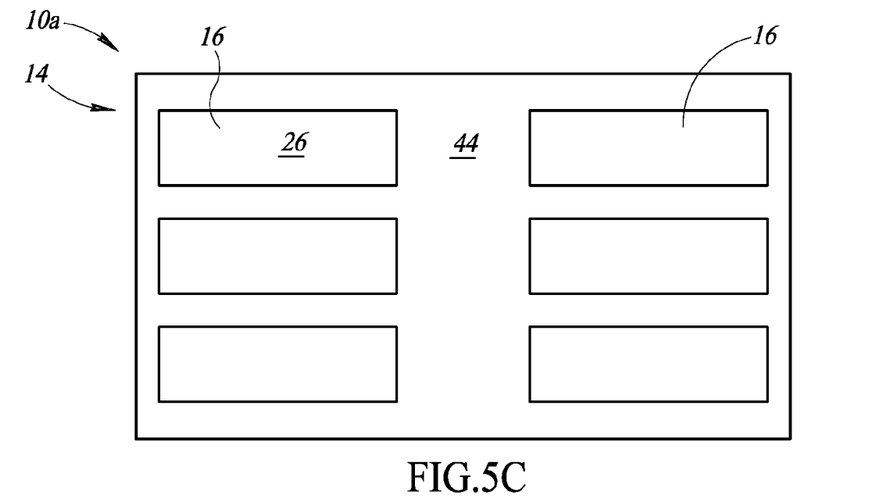

FIGS. 5A-5C illustrate a leadless package 10a in accordance with another embodiment of the present disclosure. The leadless package 10a of FIGS. 5A-5C is substantially identical in structure and assembly processing to the leadless package 10 of FIGS. 1A-1D and thus those features will not be repeated in the interest of brevity. The package 10a of FIGS. 5A-5C differs from the package 10 of FIGS. 1A-1D in that the leads 16 do not extend to the edge of the package 10a and the semiconductor die 18 is attached to the leads in a flip chip arrangement. In particular, the first surface of the semiconductor die 18 is facing the inner surface 25 of the lower portion 22 of the leads 16. Conductive bumps 70, such as solder bumps, electrically couple bond pads of the semiconductor die 18 to the inner surface 25 of the lower portion 22 of the leads 16. It is to be appreciated that any of the embodiments described herein may be directed to the semiconductor die 18 being mounted on the leads 16 in the flip chip arrangement or by wire bonding. That is, the die in package 10 may be electrically coupled to the leads in a flip chip configuration, and the die in package 10*a* may be electrically coupled to the leads by wiring bonding, as is well known in the art.

As indicated above, the leads 16 of the package 10*a* do not extend to the edge of the package 10*a*. Rather, the encapsulation material 42 and the back filling material 44 are located around a periphery of the package 10*a* as shown in FIGS. 5B and 5C.

FIGS. 6A-6F illustrate cross-sectional views of various stages of assembling a package 10*a* in accordance with another embodiment of the disclosure. Generally described, the assembly process of FIGS. 6A-6F differs from the assembly process of FIGS. 4A-4G in that the leadframe material is not completely etched away in the dicing streets. Furthermore, the leads 16 are formed so that they do not extend to the side surfaces of the package 10*a*. Rather, the leads 16 are in a pullback configuration in that the leads are offset from the edge of the package and the encapsulation material 42 and the back filling material 44 are located at the edge or side surface of the package. It is to be appreciated that the pullback leads may be utilized with the assembly process described in reference to FIGS. 4A-4F as well. Finally, the semiconductor die 18 is electrically and mechanically coupled to the leads 16 in a flip chip configuration.

Figure 6A:
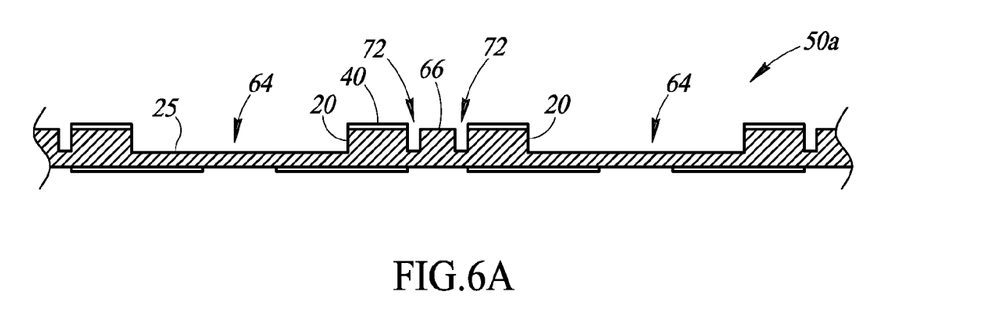
FIGS. 6A-6F illustrate cross-sectional views of various stages of another assembly process for forming packages, such as the package of FIGS. 5A-5C, in accordance with another embodiment of the present disclosure.

As shown in FIG. 6A, a leadframe strip 50*a* may be formed to have cavities 72 located outward of the leads 16 on opposing sides of the dicing streets. The cavities 72 may be formed at any stage including while processing the leadframe strip 50. For instance, the cavities may be formed at the same time openings 64 are etched in reference to FIG. 3E as will be clear to persons of ordinary skill in the art. Alternatively, cavities 72 may be etched in a later step.

Figure 6B:
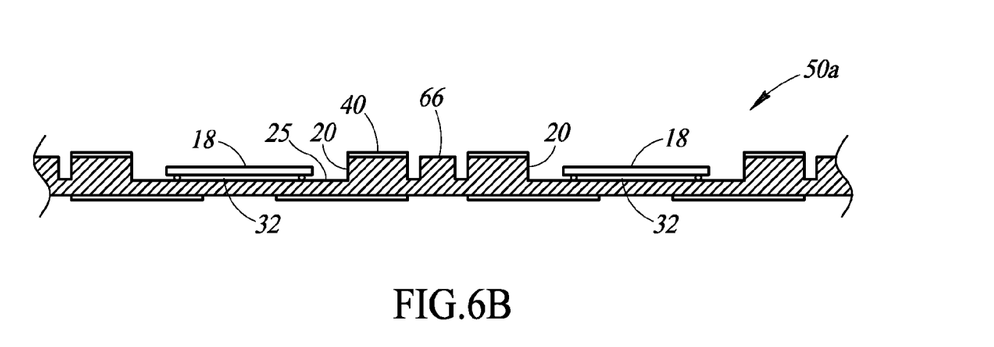

As shown in FIG. 6B, semiconductor dice 18 are coupled to the inner surface 25 of the leadframe strip 50*a* between upper portions 20 of the leads 16 in the flip chip arrangement as is well known in the art. For instance, conductive bumps 70 may be coupled to the bond pads of the semiconductor dice 18 and then mounted on the leads 16. Underfill material (not shown) may be provided between the semiconductor dice 18 and the inner surface 25 of the leads 16.

Figure 6C:
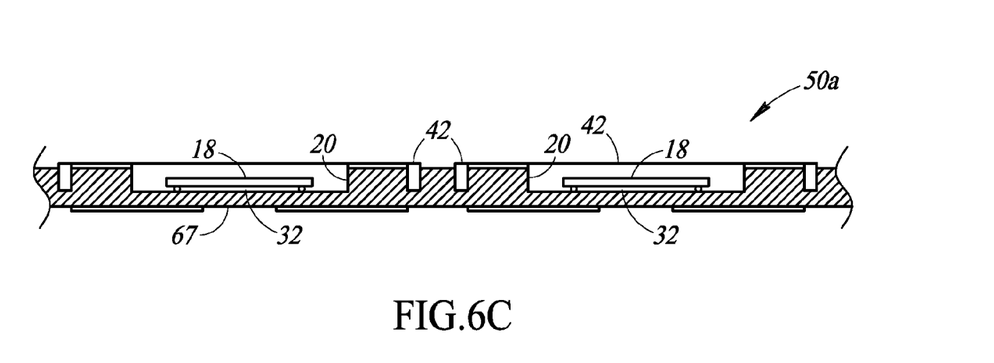

As shown in FIG. 6C, encapsulation material 42 is formed around the semiconductor dice 18. The encapsulation material 42 is also molded in the cavities 72.

Figure 6D:
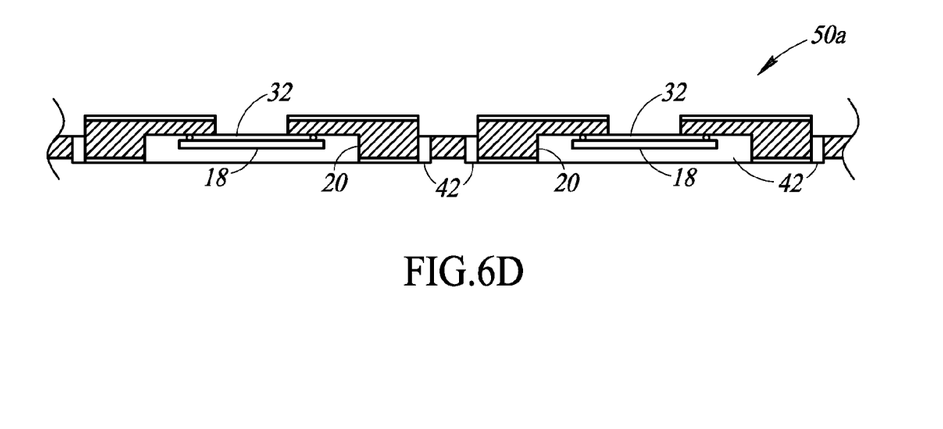

As shown in FIG. 6D, the leadframe strip 50*a* is flipped over so that the lower surface of the leadframe strip is facing up and portions of the leadframe strip 50*a* are etched from the lower surface. In particular, portions of the leadframe material that is exposed and not covered by one or more conductive layers 40 are etched. For instance, the inner connecting portions 67 are etched to expose the semiconductor die 18. Additionally, connecting portions 66 are also etched. The connecting portions 66, however, are not etched entirely through but only partway through as shown in FIG. 6D.

Figure 6E:
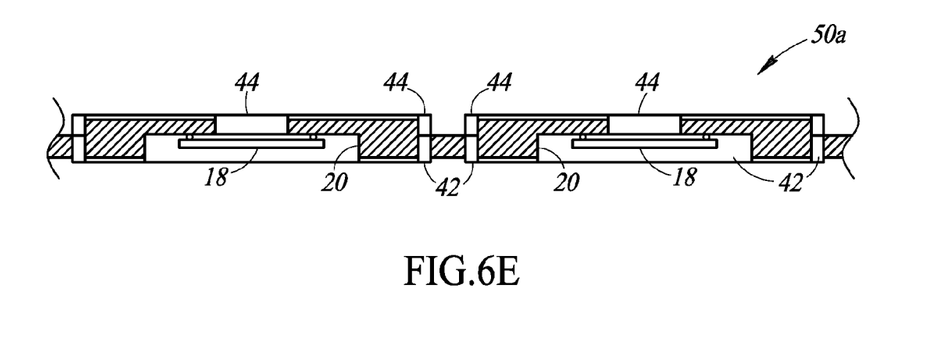

As shown in FIG. 6E, a back filling material 44 is deposited over the semiconductor die 18 and over the encapsulation material 42 that was filled into the cavities. Although not shown, the back filling material 44 may be deposited over the connecting portion 66 of the leadframe material that remains.

Figure 6F:
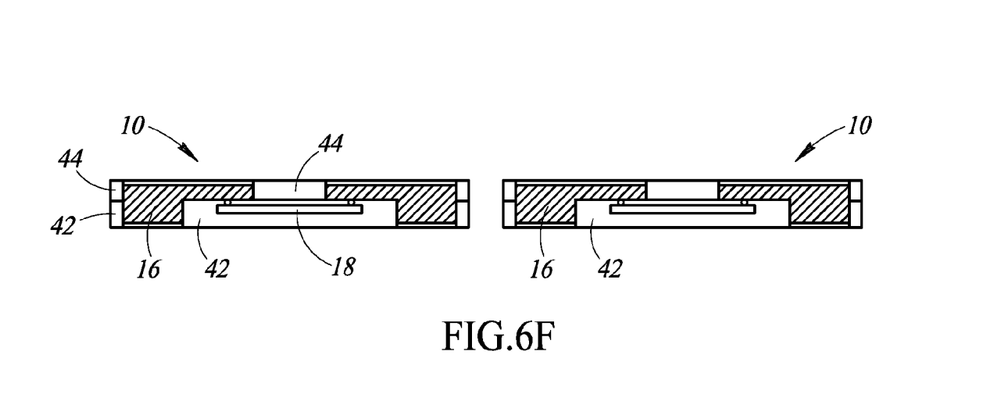

With reference to FIG. 6F, the method includes separating each package into individual packages 10*a*.

Figure 7A:
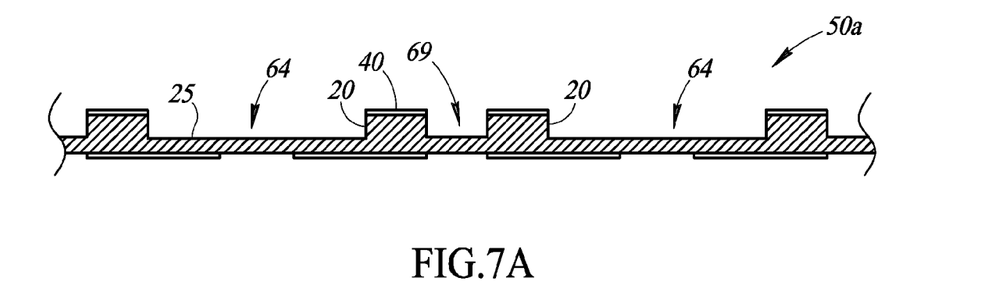
FIGS. 7A-7F illustrate cross-sectional views of various stages of another assembly process for forming packages, such as the package of FIGS. 5A-5C, in accordance with yet another embodiment of the present disclosure.
Figure 7B:
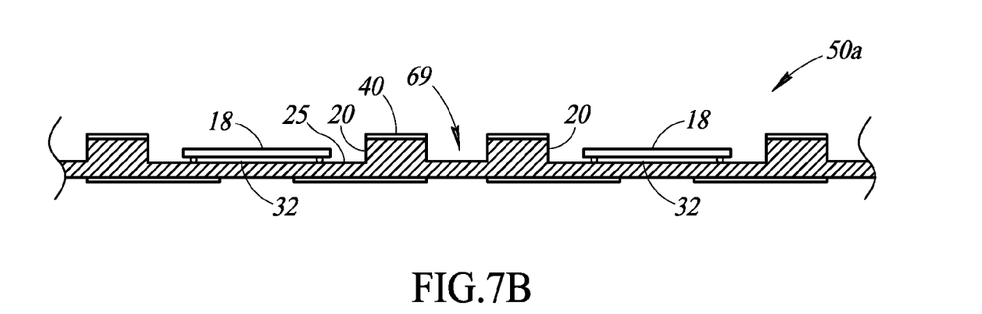
Figure 7C:
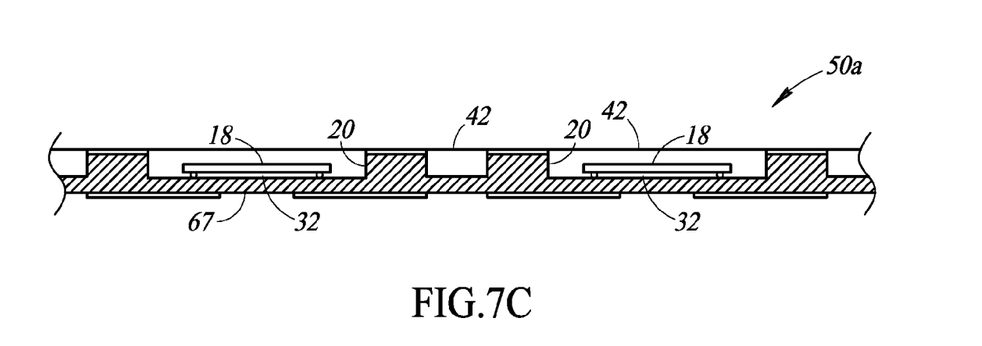
Figure 7D:
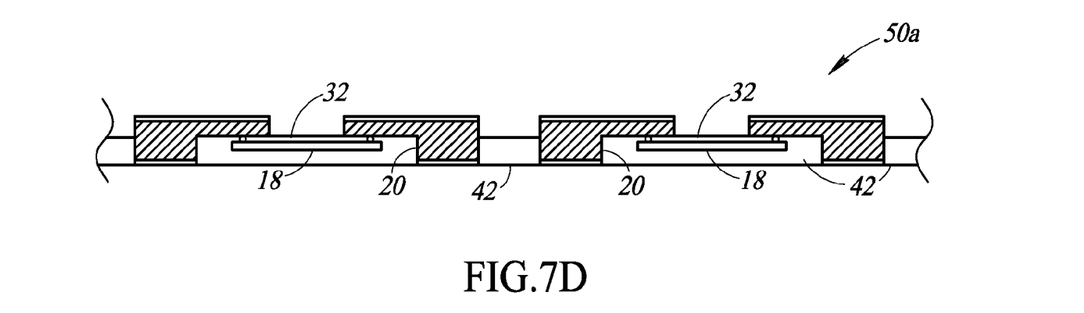
Figure 7E:
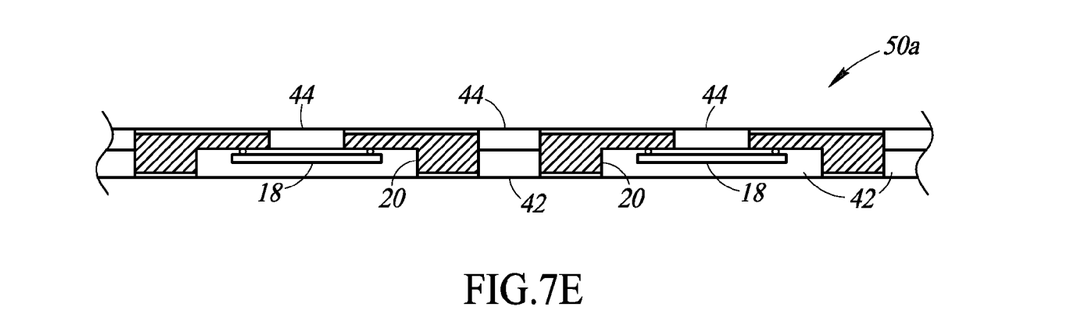
Figure 7F:
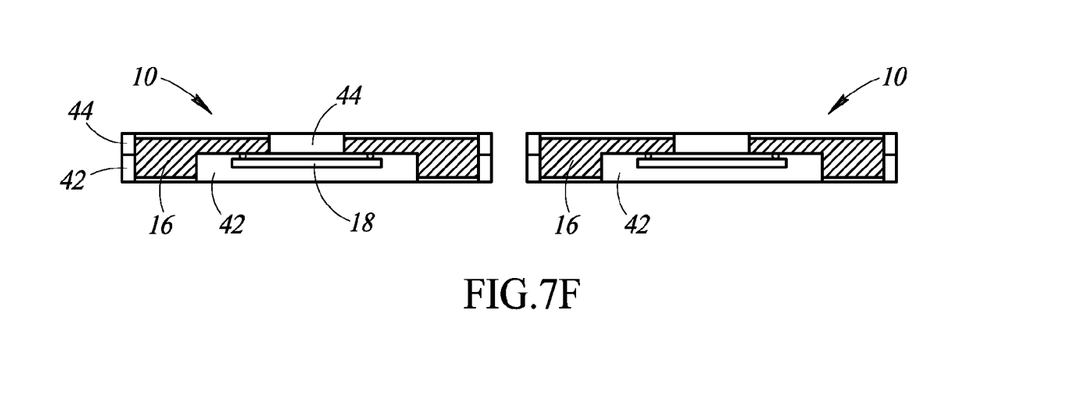

FIGS. 7A-7F illustrate cross-sectional views of various stages of assembling the package 10*a* in accordance with another embodiment of the disclosure. Generally described, the assembly process of FIGS. 7A-7F is substantially identical to the assembly process of FIGS. 6A-6F. The difference, however, is that when openings 64 are formed, openings 69 are also formed, rather than cavities 72. The openings 69 are located between adjacent leads 20 of adjacent packages. As shown in FIG. 7C, the encapsulation material 42 fills the opening 69 during the same step in which the encapsulation material 42 is formed in the opening 64 around the semiconductor die 18. Thus, during the etch step of FIG. 7D, all of the leadframe material is removed between adjacent packages exposing the encapsulation material 42 below. As shown in FIG. 7E, the back filling material 44 is deposited over the exposed encapsulation material 42 between the adjacent packages. Singulation as shown in FIG. 7F may occur by cutting or stamping through the encapsulation material 42.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
    a plurality of leads of a leadframe, the plurality of leads having upper portions with upper outer surfaces, lower portions with lower outer surfaces, and inner surfaces;
    a semiconductor die having first and second surfaces, the semiconductor die located between the upper outer surfaces and the lower outer surfaces of the plurality of leads, a periphery portion of the second surface of the semiconductor die coupled to the inner surfaces of the plurality of leads;
    conductive coupling elements that electrically couple the semiconductor die to the inner surfaces of the plurality of leads;
    encapsulation material around the first surface of the semiconductor die, the conductive coupling elements, and between the upper portions of the plurality of leads; and
    an insulating material between the lower portions of the plurality of leads, the insulating material being a different material from the encapsulation material, the insulating material supporting a center portion of the second surface of the semiconductor die, the lower outer surfaces of the lower portions of the plurality of leads occupying 50% to 70% of a lower surface of the semiconductor package and act as heatsinks.

2. The semiconductor package of claim 1, wherein the upper outer surfaces of the plurality of leads and the insulating material form an outer surface of the package, wherein the upper outer surfaces of the plurality of leads takes up 50% to 75% of a total surface area of the outer surface.

3. The semiconductor package of claim 1, wherein the insulating material is an epoxy, silicon, or photoresist.

4. The semiconductor package of claim 1, wherein the plurality of leads extends to side surfaces of the package.

5. The semiconductor package of claim 1, wherein the encapsulation material and the insulating material have surfaces that abut each other.

6. The semiconductor package of claim 1, wherein the plurality of leads are offset from outer surfaces of the package.

7. The semiconductor package of claim 1 further comprising an adhesive material between the center portion of the second surface of the semiconductor die and the insulating material.

8. A semiconductor package comprising:
a plurality of leads of a leadframe, the plurality of leads having upper portions and lower portions, the lower portions including inner surfaces;
a semiconductor die located between the upper portions of the plurality of leads, the semiconductor die coupled to the inner surfaces of the lower portions of the plurality of leads;
conductive coupling elements that electrically couple the semiconductor die to the inner surfaces of the lower portions of the plurality of leads;
encapsulation material around the semiconductor die, the conductive coupling elements, and between the upper portions of the plurality of leads; and
an insulating material between the lower portions of the plurality of leads, wherein the insulating material is a different material from the encapsulation material, lower outer surfaces of the lower portions of the plurality of leads occupying 50% to 70% of a lower surface of the semiconductor package and act as heatsinks.

9. The semiconductor package of claim 8, wherein the insulating material is facing a surface of the semiconductor die.

10. The semiconductor package of claim 9, wherein the lower portions of the plurality of leads have a surface that is coplanar with the insulating material.

11. The semiconductor package of claim 9, wherein side surfaces of the package include the encapsulation material abutting the insulating material.

12. The semiconductor package of claim 9, wherein the insulating material is an epoxy, silicon, or photoresist.

13. The semiconductor package of claim 9, wherein an upper surface of the upper portions of the plurality of leads and the insulating material form an outer surface of the package, wherein the upper surface of the upper portions of the plurality of leads takes up 50% to 75% of a total surface area of the outer surface.

14. The semiconductor package of claim 8, wherein the conductive coupling elements are conductive bumps having first ends coupled to bond pads of the semiconductor die and second ends coupled to the inner surfaces of the lower portions of the plurality of leads.

15. The semiconductor package of claim 8, wherein the conductive coupling elements are conductive wires having first ends coupled to bond pads of the semiconductor die and second ends coupled to the inner surfaces of the lower portions of the plurality of leads.

16. The semiconductor package of claim 8, wherein the plurality of leads is exposed at side surfaces of the package.

17. A method comprising:
coupling a periphery portion of a first surface of a semiconductor die to inner surfaces of lower portions of a plurality of leads of a leadframe, wherein the semiconductor die is located between upper portions of the plurality of leads;
encapsulating the semiconductor die and between upper portions of the plurality of leads with encapsulation material; and
forming an insulating material over the first surface of the semiconductor die and between lower portions of the plurality of leads to form a semiconductor package, the insulating material being a different material from the encapsulation material, wherein lower outer surfaces of the lower portions of the plurality of leads occupies 50% to 70% of a lower surface of the semiconductor package and act as heatsinks.

18. The method of claim 17, wherein coupling comprises electrically and mechanically coupling the semiconductor die to the inner surfaces of the lower portions of the plurality of leads by coupling conductive bumps.

19. The method of claim 17, wherein encapsulating comprises encapsulating between upper portions of the plurality of leads and exposing surfaces of the plurality of leads.

20. The method of claim 17, wherein forming an insulating material comprises depositing at least one of one of epoxy, silicon or photoresist.

21. The method of claim 17, wherein the lower portions of the plurality of leads include connecting portions, the method further comprising, prior to forming the insulating material, removing connecting portions between the lower portions of the plurality of leads.

22. The method of claim 21, wherein connecting portions are removed in dicing streets around a perimeter of the plurality of leads.

23. The method of claim 21 wherein removing connecting portions comprises etching the connecting portions between the lower portions of the plurality of leads and exposing an adhesive material at the first surface of the semiconductor die.

24. The method of claim 21 wherein removing connecting portions exposes surfaces of the encapsulation material.

\* \* \* \* \*